(12) United States Patent
Yoon et al.

(10) Patent No.: US 8,936,828 B2
(45) Date of Patent: Jan. 20, 2015

(54) METHOD OF FABRICATING SUBSTRATE WHERE PATTERNS ARE FORMED

(75) Inventors: Euijoon Yoon, Seoul (KR); Sung-Hoon Kwon, Seoul (KR)

(73) Assignee: SNU R&DB Foundation, Seoul (KR)

( * ) Notice: Subject to any disclaimer, the term of this patent is extended or adjusted under 35 U.S.C. 154(b) by 11 days.

(21) Appl. No.: 13/265,366

(22) PCT Filed: Apr. 29, 2009

(86) PCT No.: PCT/KR2009/002253
§ 371 (c)(1),
(2), (4) Date: Oct. 20, 2011

(87) PCT Pub. No.: WO2010/126177
PCT Pub. Date: Nov. 4, 2010

(65) Prior Publication Data
US 2012/0040087 A1    Feb. 16, 2012

(51) Int. Cl.
| B05D 1/12 | (2006.01) |
| B05D 1/24 | (2006.01) |
| H01L 33/22 | (2010.01) |
| C30B 33/00 | (2006.01) |

(52) U.S. Cl.
CPC .............. *H01L 33/22* (2013.01); *C30B 33/00* (2013.01)
USPC ........... 427/71; 427/199; 427/287; 427/443.2

(58) Field of Classification Search
USPC ................................. 427/71, 199, 287, 443.2
See application file for complete search history.

(56) References Cited

U.S. PATENT DOCUMENTS

| 6,143,580 A | 11/2000 | Wells et al. |
| 2006/0186424 A1 | 8/2006 | Fujimoto et al. |
| 2007/0166862 A1 | 7/2007 | Kim et al. |
| 2008/0038532 A1* | 2/2008 | Yi et al. ...................... 428/220 |
| 2008/0292805 A1 | 11/2008 | Tamura |
| 2009/0001398 A1 | 1/2009 | Song et al. |

FOREIGN PATENT DOCUMENTS

| JP | 04112527 A | 4/1992 |
| JP | 09-327881 A | 12/1997 |
| JP | 2005302321 A | 10/2005 |
| JP | 2007141885 A | 6/2007 |

* cited by examiner

*Primary Examiner* — Frederick Parker
(74) *Attorney, Agent, or Firm* — William Park & Associates Patent Ltd.

(57) ABSTRACT

Provided is a method of fabricating a substrate where patterns are formed, the method including: preparing a solution in which a plurality of oxide beads are dispersed; forming patterns on a substrate; installing a provisional structure in an upper portion of the substrate so that a micro-channel is formed on the substrate; injecting the solution in which the oxide beads are dispersed, into the micro-channel and fixing the oxide beads at the substrate; and thermally processing the substrate. A plurality of low-priced oxide beads can be patterned on a substrate to have a desired shape so that damages can be prevented from occurring in the substrate during dry etching, and an etching process is not performed so that a yield of a device is not reduced and mass production of the device increases.

11 Claims, 5 Drawing Sheets

METHOD OF FABRICATING SUBSTRATE WHERE PATTERNS ARE FORMED

TECHNICAL FIELD

The present invention relates to a substrate for a semiconductor device and a method of fabricating the same, and more particularly, to a substrate where a plurality of patterns are formed so as to be used to fabricate a high-output light emitting diode (LED), and a method of fabricating the same.

BACKGROUND ART

Light emitting diode (LED) markets have grown based on low-output LEDs used in a portable communication device such as a mobile phone, a keypad of a small-sized home appliance, or a backlight unit of a liquid crystal display (LCD). Recently, the need for high-output and high-efficiency light sources that are used in interior lighting, external lighting, internal and external spaces of a vehicle, and a backlight unit of a large-sized LCD increases, and LED markets have targeted in high-output products.

The biggest problem in LEDs is low light emitting efficiency. In general, light emitting efficiency is determined by efficiency of generating light (internal quantum efficiency), efficiency in which light is emitted to an external space of a device (external light extracting efficiency), and efficiency in which light is converted by phosphor. It is important to improve a characteristic of an active layer in view of internal quantum efficiency so as to produce high-output LEDs. However, it is very important to increase external light extracting efficiency of light that is actually generated.

The biggest hindrance that occurs when light is emitted to an external space of an LED is internal total reflection caused by a difference in refractive indexes between layers of the LED. Due to the difference in refractive indexes between the layers of the LED, about 20% of light generated is emitted to an external space of an interface between the layers of the LED. Furthermore, light that is not emitted to the external space of the interface between the layers of the LED moves within the LED and is changed into heat. As a result, light emitting efficiency is low, and the amount of heat generated in a device is increased, and the life span of the LED is reduced.

In order to improve external light extracting efficiency, a method of increasing the roughness of a p-GaN surface or an n-GaN surface, a method of making the surface of a substrate as a bottom part of the device rough or a method of forming curved patterns has been suggested.

FIG. 1 is a cross-sectional view of an LED 14 formed on a substrate 10 in which patterns 12 are formed, and FIG. 2 is a view of the substrate 10 in which the patterns 12 are formed. In particular, when the patterns 12 are formed on the substrate 10 of the LED 14 using a different substrate such as a sapphire substrate, external light extracting efficiency is improved.

Patterns formed on the surface of a sapphire substrate are calculated to increase external light extracting efficiency by 100% or more. Korean Patent Application No. 2004-0021801 and No. 2004-0049329 disclose shapes of patterns formed on the surface of the sapphire substrate or the patterns. A method of forming the patterns by using etching has been currently used. In the method of forming the patterns by using etching, in order to form semispherical patterns on a sapphire substrate, a thick layer resist having a thickness of several tens of micrometers is patterned, and then the resist and the sapphire substrate are simultaneously etched by dry etching.

In the method of forming the patterns by using etching, the height of the patterns is limited by an etching selectivity between the resist and the substrate, and due to low uniformity of a process of patterning the thick layer resist and a dry etching process, uniformity of patterns that are finally formed is low. First of all, contamination that occurs in dry etching is the biggest problem. Due to heat that is locally generated during etching, a reactant of the resist and gas that is used in etching remains on the surface of the sapphire substrate and is not completely removed even though a cleaning process is performed. In addition, damages may occur in the surface of the substrate due to high energy gas particles used in etching (Silicon processing for the VLSI ear, vol. 1, process technology, p. 574-582). When such contamination occurs, if GaN epitaxial growth as the next process is performed, defects may occur in a nitride epitaxial layer due to contamination. Due to the above disadvantage, when a device is fabricated by using the sapphire substrate that is patterned by using an etching process, a very low yield is expected.

In the above-mentioned dry etching process, in order to emit an excessive amount of heat generated when sapphire is forcibly etched, a high-priced etching equipment having a cooling function should be used. In order to improve light extracting efficiency, a process of reducing the size of patterns etched using a high-priced photographing equipment such as a stepper should be performed. Thus, costs increase when the above-mentioned dry etching process is performed. In addition, in the process in which the photographing equipment such as the stepper is used, process throughput is not easily increased due to a complicated process.

DISCLOSURE

Technical Problem

The present invention provides a method of fabricating a substrate where patterns are formed, by which, when a substrate is patterned by using an etching process, damages do not occur in a crystal of a substrate or a device characteristic is not degraded due to remnants and the uniformity of the patterns can be greatly increased.

Technical Solution

According to an aspect of the present invention, there is provided a method of fabricating a substrate where patterns are formed, the method including: preparing a solution in which a plurality of oxide beads are dispersed; forming patterns on a substrate; installing a provisional structure in an upper portion of the substrate so that a micro-channel is formed on the substrate; injecting the solution in which the oxide beads are dispersed, into the micro-channel and fixing the oxide beads at the substrate; and thermally processing the substrate.

According to another aspect of the present invention, there is provided a method of fabricating a substrate where are formed, the method including: preparing a solution in which a plurality of oxide beads are dispersed; forming patterns on a substrate; performing a process of immersing the substrate in which the plurality of patterns are formed, in a solution in which the oxide beads are dispersed and a process of taking out the substrate from the solution at least once and fixing the oxide beads at the substrate; and thermally processing the substrate.

According to another aspect of the present invention, there is provided a method of fabricating a substrate where patterns are formed, the method including: installing a provisional structure in an upper portion of a substrate so that a micro-channel is formed on the substrate; forming a bead mixture by mixing a plurality of oxide beads and a plurality of polymer beads; injecting the bead mixture into the micro-channel and assembling the oxide beads and the polymer beads on the substrate; separating the provisional structure from the substrate; removing the polymer beads; and thermally processing the substrate.

Advantageous Effects

In the method of fabricating the substrate according to the present invention, a plurality of low-priced oxide beads can be patterned on a substrate to have a desired shape so that damages can be prevented from occurring in the substrate during dry etching, and an etching process is not performed so that a yield of a device is not reduced and mass production of the device increases. In addition, a high-priced equipment for dry etching is not needed so that the method of fabricating the substrate is economical and high productivity in which large quantities of substrates are fabricated within a short time is achieved.

MODE FOR INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 3:
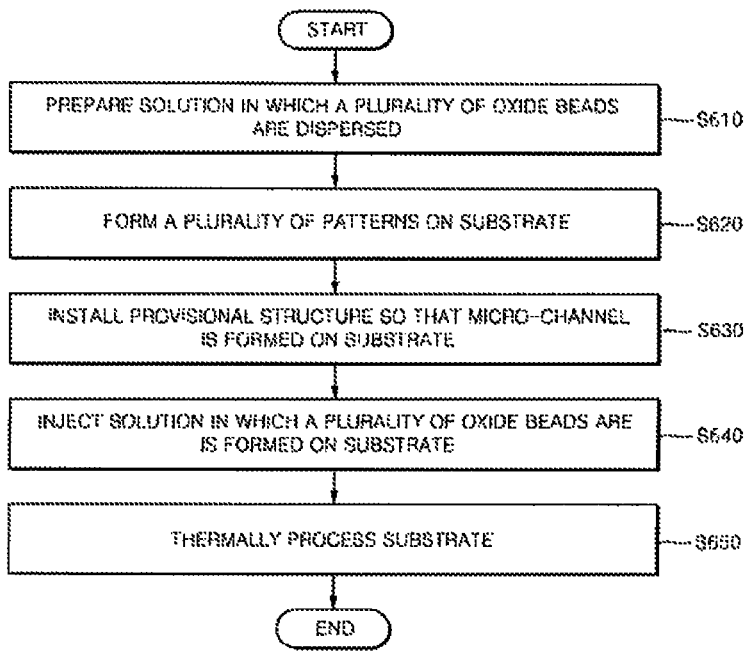
FIG. 3 is a flowchart illustrating a method of fabricating a substrate where patterns are formed by using a meniscus of a fluid, according to an embodiment of the present invention.

FIG. 3 is a flowchart illustrating a method of fabricating a substrate where patterns are formed by using a meniscus of a fluid, according to an embodiment of the present invention, and FIGS. 4 through 8 are cross-sectional views of the method of fabricating a substrate in which patterns are formed, shown in FIG. 3.

Referring to FIGS. 3 through 8, first, a solution 750 in which a plurality of oxide beads 740 are dispersed, is prepared (S610). The refractive index of each of the oxide beads 740 is 1.2 to 2.0, and each of the oxide beads 740 is formed of at least one selected from the group consisting of $SiO_2$, $Al_2O_3$, $TiO_2$, $ZrO_2$, $Y_2O_3$-$ZrO_2$, $CuO$, $Cu_2O$, $Ta_2O_5$, $PZT(Pb(Zr,Ti)O_3)$, $Nb_2O_5$, $Fe_3O_4$, $Fe_2O_3$, and $GeO_2$. The oxide beads 740 may be spherical, and the diameter of each of the oxide beads 740 is 0.1 to 10 μm. Water may be used as a solvent to disperse the oxide beads 740.

Figure 4:
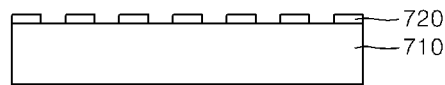
FIGS. 4 through 8 are cross-sectional views of the method of fabricating a substrate in which patterns are formed, shown in FIG. 3.
Figure 5:
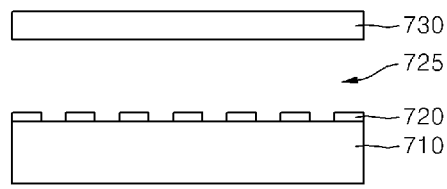

Next, as illustrated in FIG. 4, patterns 720 are formed on a substrate 710 (S620). The substrate 710 may be formed of one of sapphire, lithium aluminum oxide ($LiAlO_2$), and magnesium oxide (MgO). The patterns 720 may be a plurality of resist patterns that are formed by applying a resist layer to the substrate 710 and by performing an exposure and developing process on the resist layer. The density and size of each of the patterns 720 may be adjusted to values in which light output is maximized, by using simulation. As illustrated in FIG. 5, a provisional structure 730 is installed on the substrate 710 so as to form a micro-channel 725 (S630). The provisional structure 730 may be formed of polydimethylsilxoane (PDMS).

Figure 6:
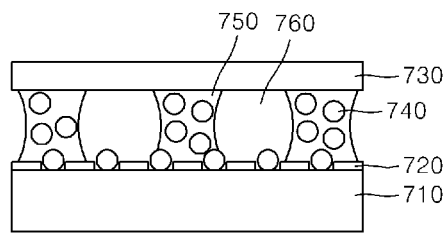
Figure 7:
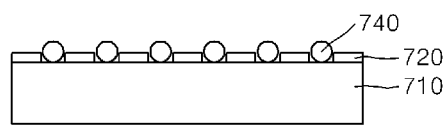

Next, the solution 750 in which the oxide beads 740 are dispersed, and gas 760 are alternately injected into the micro-channel 725 (S640). If the solution 750 in which the oxide beads 740 are dispersed and the gas 760 are alternately injected into the micro-channel 725, as illustrated in FIG. 6, the oxide beads 740 are assembled between the patterns 720 and are fixed at the substrate 710 due to a meniscus that occurs at an interface between the solution 750 and the gas 760 on the substrate 710. If the oxide beads 740 are fixed at the substrate 710, injection into the solution 750 in which the oxide beads 740 are dispersed and the gas 760 is stopped, and the provisional structure 730 is removed. This state is shown in FIG. 7.

Figure 8:
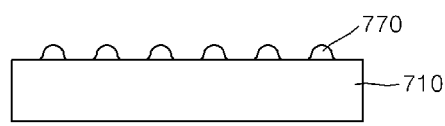

Last, the substrate 710 is thermally processed, thereby cohering the oxide beads 740 to the substrate 710 (S650). The substrate 710 is thermally processed between 500° C. and 1400° C., and may be thermally processed between 800° C. and 1200° C. If the substrate 710 is thermally processed in this way, the patterns 720 formed on the substrate 710 are removed. Thus, as illustrated in FIG. 8, the oxide beads 740 are cohered to the substrate 710, thereby fabricating the substrate 710 in which the patterned oxide beads 770 are formed.

If the substrate 710 is fabricated by using the method shown in FIG. 3, the substrate 710 having good light extracting efficiency can be fabricated.

Figure 9:
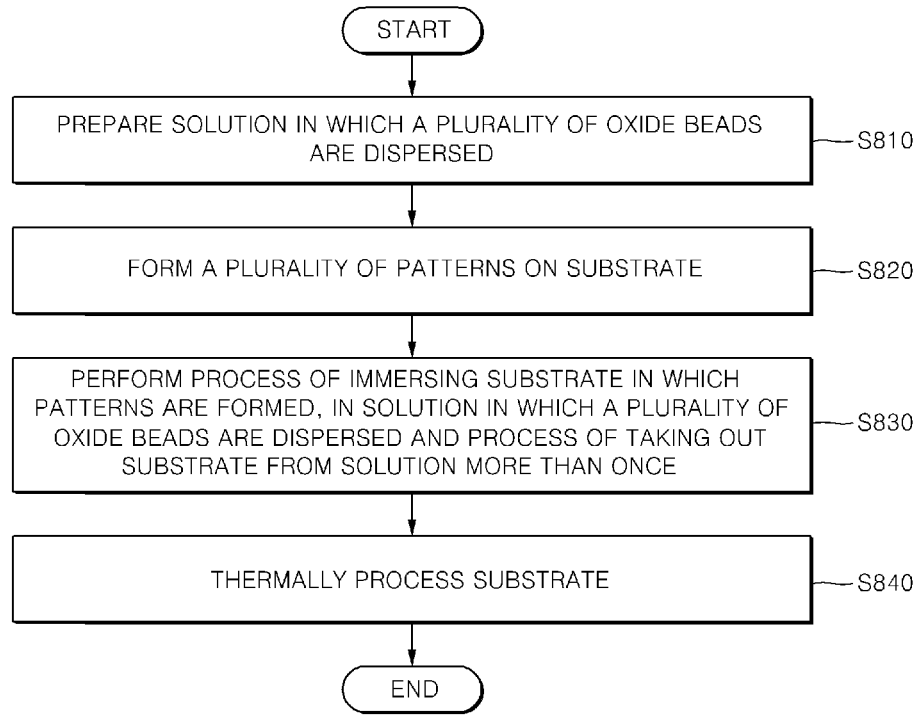
FIG. 9 is a flowchart illustrating a method of fabricating a substrate where patterns are formed by using a meniscus of a fluid, according to another embodiment of the present invention.

FIG. 9 is a flowchart illustrating a method of fabricating a substrate where patterns are formed by using a meniscus of a fluid, according to another embodiment of the present invention, and FIGS. 10 through 14 are cross-sectional views of the method of fabricating a substrate in which patterns are formed, shown in FIG. 9.

Referring to FIGS. 9 through 14, first, a solution 930 in which a plurality of oxide beads 940 are dispersed, is prepared (S810). The refractive index of each of the oxide beads 940 is 1.2 to 2.0, and each of the oxide beads 940 is formed of at least one selected from the group consisting of $SiO_2$, $Al_2O_3$, $TiO_2$, $ZrO_2$, $Y_2O_3$-$ZrO_2$, $CuO$, $Cu_2O$, $Ta_2O_5$, $PZT(Pb(Zr,Ti)O_3)$, $Nb_2O_5$, $Fe_3O_4$, $Fe_2O_3$, and $GeO_2$. The oxide beads 940 may be spherical, and the diameter of each of the oxide beads 940 is 0.1 to 10 μm. Water may be used as a solvent to disperse the oxide beads 940.

Figure 10:
FIGS. 10 through 14 are cross-sectional views of the method fabricating a substrate in which patterns are formed, shown in FIG. 9.

Next, patterns 920 are formed on a substrate 910, as illustrated in FIG. 10 (S820). The substrate 910 may be formed of one of sapphire, lithium aluminum oxide ($LiAlO_2$), and magnesium oxide (MgO). The patterns 920 may be resist patterns that are formed by applying a resist layer to the substrate 910 and by performing an exposure and developing process on the resist layer. The density and size of each of the patterns 920 may be adjusted to values in which light output is maximized, by using simulation.

Figure 11:
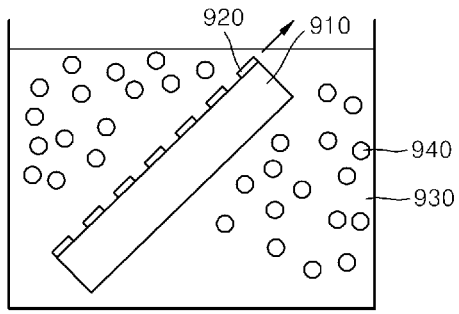
Figure 12:
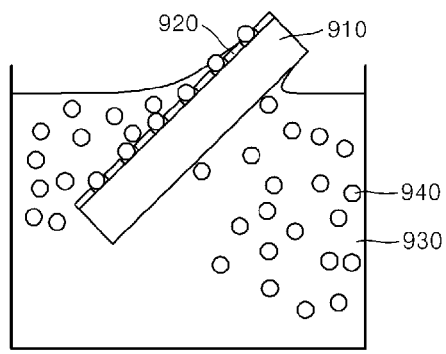

Next, as illustrated in FIGS. 11 and 12, a process of immersing the substrate 910 in which the patterns 920 are formed, in the solution 930 in which the oxide beads 940 are dispersed, and a process of taking out the substrate 910 from the solution 930 are performed more than once (S830). If the substrate 910 in which the patterns 920 are formed, is immersed in the solution 930 in which the oxide beads 940 are dispersed and is taken out from the solution 930, the oxide beads 940 are assembled between the patterns 920 and are fixed at the substrate 910 in a portion where the surface of the solution 930 in which the oxide beads 940 are dispersed, contacts with the substrate 910 due to a meniscus that occurs at an interface between the solution 930 in which the oxide beads 940 are dispersed, and an air. By repeatedly performing the above process, the oxide beads 940 can be fixed between the patterns 920.

Figure 13:
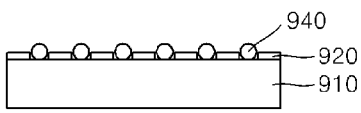

As illustrated in FIG. 13, if the oxide beads 940 are fixed at the substrate 910, the substrate 910 is taken out from the solution 950 in which the oxide beads 940 are dispersed.

Figure 14:

Last, the substrate 910 is thermally processed, thereby cohering the oxide beads 940 to the substrate 910 (S650). The substrate 910 is thermally processed between 500° C. and 1400° C., and may be thermally processed between 800° C. and 1200° C. If the substrate 910 is thermally processed in this way, the patterns 920 formed on the substrate 910 are removed. Thus, as illustrated in FIG. 14, the oxide beads 940 are cohered to the substrate 910, thereby fabricating the substrate 910 in which the patterned oxide beads 950 are formed.

If the substrate 910 is fabricated by using the method shown in FIG. 9, like in the method of FIG. 3, the substrate 910 having good light extracting efficiency can be fabricated.

As described above, the patterns 720 and 920, which are formed on the substrates 710 and 910, are physical unevennesses formed of a photosensitive material. However, the present invention is not limited to this, and the patterns 720 and 920 may be hydrophobic or hydrophile surface energy patterns. If each of the oxide beads 740 and 940 has a hydrophile property in operation S640 or S840, the oxide beads 740 and 940 are placed only on the hydrophile patterns and are not placed on the hydrophobic patterns. Contrary to this, if each of the oxide beads 740 and 940 has a hydrophobic property in operation S640 or S830, the oxide beads 740 and 940 are placed only on the hydrophobic patterns and are not placed on the hydrophile patterns. In this manner, the oxide beads 740 and 940 may be patterned on the substrates 710 and 910, and the substrates 710 and 910 may be thermally processed like in operation S650 or S840, thereby fabricating the substrates 710 and 910 in which the oxide beads 740 and 940 are patterned.

Figure 15:
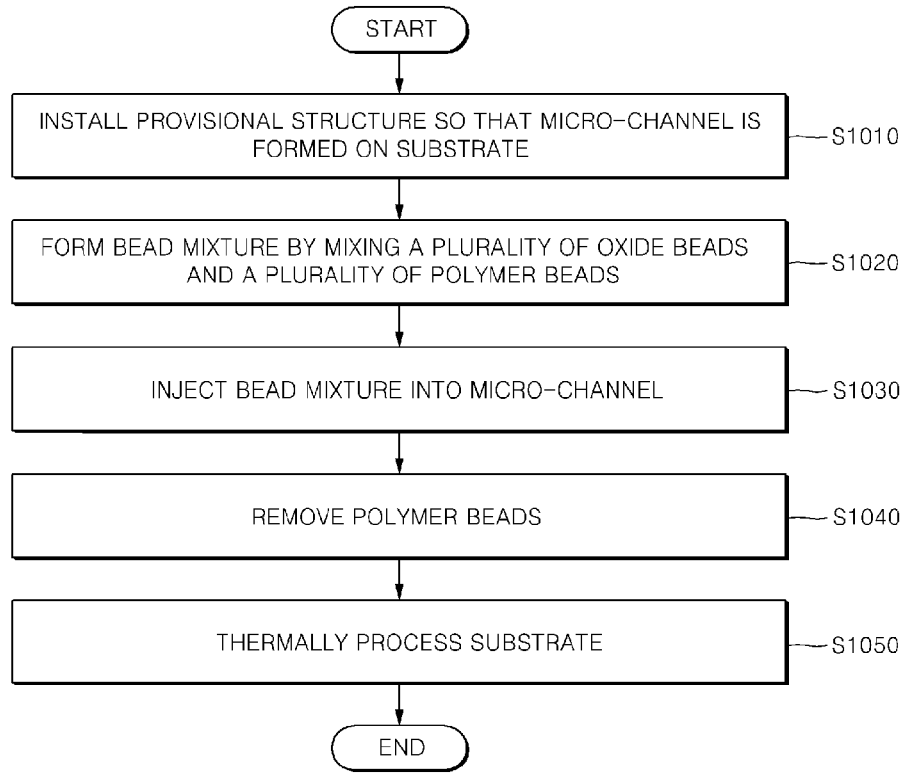
FIG. 15 is a flowchart illustrating a method of fabricating a substrate where patterns are formed by using sacrifice polymer beads, according to another embodiment of the present invention.

FIG. 15 is a flowchart illustrating a method of fabricating a substrate where patterns are formed by using sacrifice polymer beads, according to another embodiment of the present invention, and FIGS. 16 through 19 are cross-sectional views of the method of fabricating a substrate in which patterns are formed, shown in FIG. 15.

Figure 1:
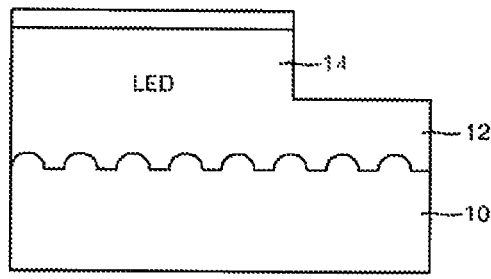
FIG. 1 is a cross-sectional view of a light emitting diode (LED) formed on a substrate in which patterns are formed.
Figure 2:
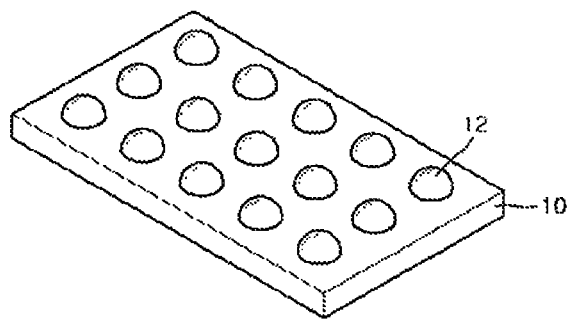
FIG. 2 is a view of the substrate in which the patterns are formed.
Figure 16:
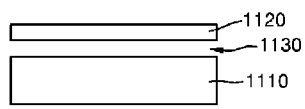
FIGS. 16 through 19 are cross-sectional views of the method of fabricating a substrate in which patterns are formed, shown in FIG. 15.

Referring to FIGS. 15 through 19, first, a provisional structure 1120 is installed on a substrate 1110 so as to form a micro-channel 1130, as illustrated in FIG. 16 (S1010). The substrate 1110 may be formed of one of sapphire, lithium aluminum oxide ($LiAlO_2$), and magnesium oxide (MgO). The provisional structure 1120 may be formed of PDMS. In this case, the micro-channel 1130 may be formed so that a bead mixture of a plurality of polymer beads 1140 and a plurality of oxide beads 1150 that will be described later can be assembled as a mono-layer. If the micro-channel 1130 is formed to a size at which the bead mixture of the polymer beads 1140 and the oxide beads 1150 can be assembled as two or more layers, the substrate 10 shown in FIG. 2 is not easily fabricated, and the polymer beads 1140 are not easily removed in operation that will be described later. Thus, the provisional structure 1120 may be installed to have a little larger size than the size of the bead mixture of the polymer beads 1140 and the oxide beads 1150 so that the bead mixture of the polymer beads 1140 and the oxide beads 1150 can be assembled as a mono-layer on the micro-channel 1130.

Next, the bead mixture is formed by mixing the oxide beads 1150 and the polymer beads 1140 (S1020). The refractive index of each of the oxide beads 1150 is 1.2 to 2.0, and each of the oxide beads 1150 is formed of at least one selected from the group consisting of $SiO_2$, $Al_2O_3$, $TiO_2$, $ZrO_2$, $Y_2O_3$-$ZrO_2$, CuO, $Cu_2O$, $Ta_2O_5$, $PZT(Pb(Zr,Ti)O_3)$, $Nb_2O_5$, $Fe_3O_4$, $Fe_2O_3$, and $GeO_2$. The oxide beads 1150 may be spherical, and the diameter of each of the oxide beads 1150 is 0.1 to 10 μm.

Figure 17:
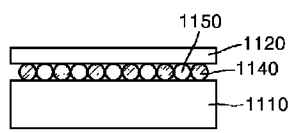

Next, the bead mixture of the polymer beads 1140 and the oxide beads 1150 is injected into the micro-channel 1130 (S1030). If the bead mixture of the polymer beads 1140 and the oxide beads 1150 is randomly assembled in the micro-channel 1130, as illustrated in FIG. 17, the provisional structure 1120 is removed.

Figure 18:
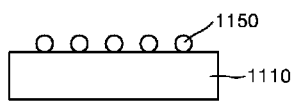

Next, the polymer beads 1140 are removed (S1040). If the provisional structure 1120 is removed, the polymer beads 1140 are removed by using a plasma process, as illustrated in FIG. 18, only the oxide beads 1150 remain on the substrate 1110. Gas plasma containing chlorine (Cl) may be used to remove the polymer beads 1140.

Figure 19:

Last, the substrate 1110 is thermally processed, thereby cohering the oxide beads 1150 to the substrate 1110 (S1050). The substrate 1110 is thermally processed between 500° C. and 1400° C., and may be thermally processed between 800° C. and 1200° C. If the substrate 1110 is thermally processed in this way, as illustrated in FIG. 19, the oxide beads 1150 are cohered to the substrate 1110, thereby fabricating the substrate 1110 in which the patterned oxide beads 1160 are formed.

If the substrate 1110 is fabricated by using the method shown in FIG. 15, like in the method of FIGS. 3 and 9, the substrate 1110 having good light extracting efficiency can be fabricated.

As described above, in the method of fabricating the substrate according to the present invention, a plurality of low-priced oxide beads can be patterned on a substrate to have a desired shape so that damages can be prevented from occurring in the substrate during dry etching, and an etching process is not performed so that a yield of a device is not reduced and mass production of the device increases. In addition, a high-priced equipment for dry etching is not needed so that the method of fabricating the substrate is economical and high productivity in which large quantities of substrates are fabricated within a short time is achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a substrate where patterns are formed, the method comprising:
   preparing a solution in which a plurality of oxide beads are dispersed;

forming patterns on a substrate;

installing a provisional structure in an upper portion of the substrate so that a micro-channel is formed on the substrate;

injecting the solution in which the oxide beads are dispersed, into the micro-channel and fixing the oxide beads at the substrate; and thermally processing the substrate, wherein the injecting of the solution in which the oxide beads are dispersed, into the micro-channel comprises alternately injecting the solution in which the oxide beads are dispersed, and air.

2. The method of claim 1, wherein the substrate is formed of one of sapphire, lithium aluminum oxide ($LiAlO_2$), and magnesium oxide (MgO).

3. The method of claim 1, wherein a refractive index of each of the oxide beads is 1.2 to 2.0.

4. The method of claim 1, wherein each of the oxide beads is formed of at least one selected from the group consisting of $SiO_2$, $Al_2O_3$, $TiO_2$, $ZrO_2$, $Y_2O_3$-$ZrO_2$, CuO, $Cu_2O$, $Ta_2O_5$, PZT(Pb(Zr,Ti)$O_3$), $Nb_2O_5$, $Fe_3O_4$, $Fe_2O_3$, and $GeO_2$.

5. The method of claim 1, wherein the oxide beads are spherical.

6. The method of claim 5, wherein a diameter of the oxide beads is 0.1 to 10 μm.

7. The method of claim 1, wherein the thermally processing of the substrate is performed between 500° C. to 1400° C.

8. The method of claim 1, wherein the provisional structure is formed of polydimethylsilxoane (PDMS).

9. The method of claim 1, wherein the patterns are physical unevennesses formed of a resist.

10. The method of claim 1, wherein the patterns are surface energy patterns.

11. The method of claim 10, wherein the surface energy patterns are hydrophobic or hydrophile patterns.

* * * * *